United States Patent [19]

Gensho et al.

[11] 4,192,684
[45] Mar. 11, 1980

[54] PHOTOSENSITIVE COMPOSITIONS CONTAINING HYDROGENATED 1,2-POLYBUTADIENE

[75] Inventors: Takahashi Gensho; Yanai Masamitsu; Kurihara Masakazu; Tanaka Yoneharu; Suzuoki Kazuhiro, all of Fuji, Japan

[73] Assignee: Asahi Kasei Kogyo Kabushiki Kaisha, Osaka, Japan

[21] Appl. No.: 898,258

[22] Filed: Apr. 20, 1978

Related U.S. Application Data

[63] Continuation of Ser. No. 760,211, Jan. 17, 1977, abandoned.

[30] Foreign Application Priority Data

Jan. 24, 1976 [JP] Japan .................................. 51/6877

[51] Int. Cl.$^2$ .................................................. G03C 1/68
[52] U.S. Cl. .............................. 430/284; 204/159.15; 204/159.19; 430/285; 430/281
[58] Field of Search ........................ 96/115 R, 115 P; 204/159.15, 159.19

[56] References Cited

U.S. PATENT DOCUMENTS

| | | | |
|---|---|---|---|
| 3,855,379 | 12/1974 | Araki et al. | 204/159.19 |
| 4,001,015 | 1/1977 | Barzyski et al. | 96/115 R |
| 4,004,997 | 1/1977 | Tsukamoto et al. | 96/115 R |
| 4,023,973 | 5/1977 | Imaizumi et al. | 96/115 R |

*Primary Examiner*—Jack P. Brammer
*Attorney, Agent, or Firm*—Sprung, Felfe, Horn, Lynch & Kramer

[57] ABSTRACT

A photosensitive composition comprising:
(I) a prepolymer having terminal ethylenically unsaturated groups and a number average molecular weight of about 2,000 to 30,000 whose main segment is (i) a residue of a hydrogenated 1,2-polybutadiene having about 1.2 to 2.0 terminal hydroxy groups as average per molecule and a hydrogenation ratio of pendent vinyl groups of the 1,2-addition units of about 50 to 100 percent, (ii) a residue of a chain extended hydrogenated 1,2-polybutadiene having 2 to 20 urethane bonds obtained by reaction between the hydrogenated 1,2-polybutadiene and diisocyanate, (iii) a residue of a hydrogenated 1,2-polybutadiene having terminal carboxyl groups obtained by reaction between the hydrogenated 1,2-polybutadiene and a dicarboxylic acid or (iv) a residue of a chain extended hydrogenated 1,2-polybutadiene having terminal carboxyl groups obtained by reaction between a chain extended hydrogenated 1,2-polybutadiene having terminal hydroxy groups and 2 to 20 urethane bonds having been prepared by reaction between the hydrogenated 1,2-polybutadiene and the diisocyanate, and a dicarboxylic acid, (II) at least one polymerizable ethylenically unsaturated compound, (III) a photopolymerization initiator, and (IV) a stabilizer; useful in the preparation of relief image, especially flexographic printing plates having superior resistance to solvent type flexographic ink and mechanical properties.

25 Claims, No Drawings

PHOTOSENSITIVE COMPOSITIONS CONTAINING HYDROGENATED 1,2-POLYBUTADIENE

This is a continuation of application Ser. No. 760,211, filed Jan. 17, 1977, now abandoned.

BACKGROUND OF THE INVENTION

This invention relates to novel photosensitive compositions. More particularly, it is concerned with photosensitive compositions which are photopolymerizable by the action of actinic light and which are useful in the preparation of relief image, especially relief printing plates for flexographic printing having superior resistance to solvent type flexographic ink and mechanical properties.

Many prior art references teach various photosensitive compositions useful in the preparation of relief printing plates. The flexographic printing plates obtained from unsaturated polyester type photosensitive compositions disclosed in, for example, Japanese Pat. No. 542,045 are insuffficient in resistance to solvent type flexographic ink containing organic solvents including lower alkyl alcohols such as methyl alcohol, ethyl alcohol and isopropyl alcohol; esters such as ethyl acetate and n-butyl acetate; and ketones such as acetone and methylethyl ketone. Japanese Patent Laid Open 37521/1972 describes photosensitive compositions containing a specific block copolymer as a binder and the relief printing plates obtained therefrom having good resistance to alcohol based solvent type flexographic ink. However, these compositions which are solid would be economically disadvantageous in order to provide a variety of the photosensitive elements in accordance with their use conditions such as the thickness of flexographic printing plates selected, usually from about 0.4 mm. to 10 mm. and the printing machine employed. The flexographic printing plates obtained from the photosensitive compositions containing a polyester-polyether block polymer described in British Pat. No. 1,425,274 have improved mechanical properties and printing durability but their ink resistance to solvent type flexographic ink is still not enough.

THE INVENTION

According to this invention there is provided a photosensitive composition comprising:

(I) 100 parts by weight of one prepolymer having terminal ethylenically unsaturated groups and a number average molecular weight of about 2,000 to 30,000 whose main segment is (i) a residue of a hydrogenated 1,2-polybutadiene having about 1.2 to 2.0 terminal hydroxy groups as average per molecule and a hydrogenation ratio of pendent vinyl groups of the 1,2-addition units of about 50 to 100 percent, (ii) a residue of a chain extended hydrogenated 1,2-polybutadiene having 2 to 20 urethane bonds obtained by reaction between the hydrogenated 1,2-polybutadiene and a diisocyanate, (iii) a residue of a hydrogenated 1,2-polybutadiene having terminal carboxyl groups obtained by reaction between the hydrogenated 1,2-polybutadiene and a dicarboxylic acid or (iv) a residue of a chain extended hydrogenated 1,2-polybutadiene having terminal carboxyl groups obtained by reaction between a chain extended hydrogenated 1,2-polybutadiene having terminal hydroxy groups and 2 to 20 urethane bonds having been prepared by reaction between the hydrogenated 1,2-polybutadiene and the diisocyanate, and a dicarboxylic acid, (II) about 5 to 100 parts by weight of at least one polymerizable ethylenically unsaturated monomeric compound, (III) a photopolymerization initiator in an amount of about 0.001 to 10 weight percent of the total weight of the prepolymer (I) and the polymerizable ethylenically unsaturated monomeric compound (II), and (IV) a stabilizer in an amount of about 0.001 to 2.0 weight percent of the total weight of the prepolymer (I) and the polymerizable ethylenically unsaturated monomeric compound (II).

The photosensitive compositions according to this invention are liquid and have a suitable viscosity from the viewpoint of processability.

The hydrogenated 1,2-polybutadienes which may be employed in the preparation of the prepolymers in this invention mean 1,2-polybutadienes in which at least about 50 percent of pendent vinyl groups of the 1,2-addition units are hydrogenated and poly-1-butenes. The hydrogenation ratio greatly affects the mechanical properties of photopolymerized articles. When the hydrogenated 1,2-polybutadiene having a hydrogenation ratio of less than 50 percent is employed the rubber elasticity of flexographic printing plates obtained therefrom is reduced and the hardness becomes higher, and accordingly good printing quality cannot be produced.

Also the hydrogenated 1,2-polybutadienes according to this invention have at least about 1.2 and preferably 1.5 to 2.0 terminal hydroxy groups as average per molecule. When the average number of terminal hydroxy group per molecule is below 1.2, there cannot be obtained flexographic printing plates having sufficient mechanical strength. On the other hand, when the average number of terminal hydroxy groups per molecule increases to 2, the elongation and especially the mechanical strength are more improved.

The hydrogenated 1,2-polybutadienes according to this invention may contain 0 to about 20 percent of 1,4-addition units.

These hydrogenated 1,2-polybutadienes having at least about 1.2 terminal hydroxy groups may be either commercially available ones or those produced by conventional methods. For example, one method comprises subjecting butadiene to anion polymerization, adding ethylene oxide to the terminals of the resulting polybutadiene to give terminal hydroxy groups and subsequently hydrogenating the pendent vinyl groups of the 1,2-addition units. Another method comprises polymerizing butadiene using a metal salt such as $NaPdCl_4$, $KPdCl_4$, $NH_4PdCl_4$ or $PdBr_2$ as a polymerization initiator, introducing hydroxy groups to the terminals of the resulting polybutadiene and hydrogenating the vinyl groups of the 1,2-addition units. Still other method comprises subjecting 1-butene to radical polymerization using a peroxide or azo compound having a hydroxy group such as tert-butyl-$\beta$-hydroxyethyl peroxide or 4,4'-azo-bis-4-cyano-n-amyl alcohol to produce poly-1-butenes having terminal hydroxy groups.

The prepolymers having terminal polymerizable ethylenically unsaturated groups which may be employed in this invention include the following five types of prepolymers:

The prepolymers (I) may be prepared by effecting reaction between the hydrogenated 1,2-polybutadienes having terminal hydroxy groups and (a) a carboxylic acid or dicarboxylic acid having 3 to 5 carbon atoms and one ethylenically unsaturated group, its anhydride, its chloride or the dicarboxylic acid monoester of a lower alkyl alcohol having 1 to 3 carbon atoms.

Exemplary carboxylic acids, dicarboxylic acids, anhydrides, chlorides and monoesters (a) include acrylic acid, methacrylic acid, acrylic anhydride, methacrylic anhydride, acrylic chloride, methacrylic chloride, itaconic anhydride, monomethyl, monoethyl, mono-n-propyl or monoisopropyl ester of itaconic acid, monomethyl, monoethyl, mono-n-propyl or monoisopropyl ester of maleic or fumaric acid.

For this reaction any conventional method may be employed. For example, the reaction is carried out in the presence or absence of an esterification catalyst such as p-toluenesulfonic acid or sulfuric acid, and a thermal polymerization inhibitor such as hydroquinone at a temperature of about 60° C. to 180° C. in a nitrogen atmosphere.

The prepolymers (II) of this invention may be prepared by effecting reaction between a chain extended hydrogenated 1,2-polybutadiene whose terminals are hydroxy groups and (a) the carboxylic acid having 3 to 5 carbon atoms and one ethylenically unsaturated group as employed in the preparation of the prepolymers (I) by any conventional method as in the preparation of the prepolymer (I).

The prepolymers (III) of this invention may be prepared by effecting reaction between a chain extended hydrogenated 1,2-polybutadiene whose terminals are isocyanates and (b) an alcohol having one to three ethylenically unsaturated groups by conventional methods. For example, the reaction is carried out at a temperature of about 50° C. to 120° C. in the presence or absence of a catalyst such as dibutyltin dilaurate and preferably a thermal polymerization inhibitor such as hydroquinone under a dry air atmosphere.

Exemplary alcohols (b) include:

(i) a compound selected from the group consisting of

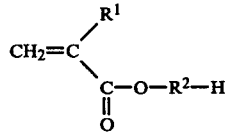

wherein

R$^1$ represents a hydrogen atom or methyl group,
R$^2$ represents oxycyclohexylene group, —CH$_2$C(CH$_3$)$_2$CH$_2$O— group, —CH$_2$C(CH$_2$Br)$_2$CH$_2$O— group, an oxyalkylene group of the formula

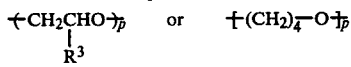

wherein

R$^3$ represents a hydrogen atom, methyl, monochloromethyl or monobromomethyl group;
p represents an integer of 1 to 20 or —(CH$_2$)$_q$O— group wherein q represents an integer of 5 to 20, (ii) trimethylolpropane di-acrylate or -methacrylate, trimethylolethane di-acrylate or -methacrylate, glycerine di-acrylate or -methacrylate and pentaerythritol tri-acrylate or -methacrylate, and (iii) allyl alcohol, 2-bromoallyl alcohol, 2-chloroallyl alcohol, glycerol diallyether, trimethylolpropane diallyether and allyl vinyl carbinol.

Examples of suitable compounds (i) include 2-hydroxyethyl acrylate or methacrylate, 2-hydroxypropyl acrylate or methacrylate, 3-bromo-2-hydroxypropyl acrylate or methacrylate, 3-chloro-2-hydroxypropyl acrylate or methacrylate, 4-hydroxy-n-butyl acrylate or methacrylate, neopentyl glycol monoacrylate or monomethacrylate, dibromoneopentyl glycol monoacrylate or monomethacrylate, 1,6-hexanediol monoacrylate or monomethacrylate, 1,8-octanediol monoacrylate or monomethacrylate, 1,9-nonanediol monoacrylate or monomethacrylate, 1,10-decanediol monoacrylate or monomethacrylate, 1,12-dodecanediol monoacrylate or monomethacrylate, 1,18-octadecanediol monoacrylate or monomethacrylate, diethylene glycol monoacrylate or monomethacrylate, dipropylene glycol monoacrylate or monomethacrylate, dibutylene glycol monoacrylate or methacrylate, tetraethylene glycol monoacrylate or methacrylate, monoacrylates or methacrylates of polyoxyethylene diols having a number average molecular weight of about 200 to 900 monoacrylates or monomethacrylates of polyoxypropylene diols having a number average molecular weight of about 200 to 1,200 and monoacrylates or monomethacrylates of polyoxybutylene diols having a number average molecular weight of about 200 to 1,500, and

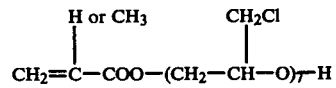

The prepolymers (IV) may be prepared by effecting reaction between a hydrogenated 1,2-polybutadiene having terminal carboxyl groups obtained by reaction between (i) the hydrogenated 1,2-polybutadiene having terminal hydroxy groups and (ii) a dicarboxylic acid, and (c) a compound having one ethylenically unsaturated group and one oxirane ring.

Exemplary dicarboxylic acids include oxalic acid, malonic acid, succinic acid, succinic anhydride, glutaric acid, adipic acid, pimelic acid, azelaic acid, sebacic acid, cyclopentane 1,3-dicarboxylic acid, cyclohexane 3,6-dicarboxylic acid, terephthalic acid, isophthalic acid, phthalic acid and phthalic anhydride.

Exemplary compounds (c) include glycidyl acrylate, glycidyl methacrylate, allyl glycidyl ether, glycidyl α-ethyl crotonyl glycicyl ether, glycidyl crotonate, monomethyl or monethyl itaconate monoglycidyl ester and monomethyl or monoethyl fumarate monoglycidyl ester.

For these two reactions any conventional method may be employed. For example, the esterification may be carried out in the same manner as in the preparation of the prepolymers (I). The reaction with the compound may be carried out at a temperature of about 60° C. to 180° C. in the presence of an epoxy ring opening catalyst such as trimethylbenzy ammonium hydroxide and a thermal polymerization inhibitor such as hydroquinone under a dry air atmosphere.

The prepolymers (V) may be prepared by effecting reaction between a chain extended hydrogenated 1,2-polybutadiene having terminal carboxyl groups obtained by reaction between (i) the chain extended hydrogenated 1,2-polybutadiene having terminal hydroxy groups and (ii) the dicarboxylic acid as employed in the preparation of the prepolymers (IV), and (c) the compound having one ethylenically unsaturated group and one oxirane ring as employed in the preparation of the prepolymers (IV) by any conventional method as in the preparation of the prepolymer (IV).

The chain extended hydrogenated 1,2-polybutadienes which are employed in the preparation of the prepolymers (II), (III) and (V) are prepared by reacting the hydrogenated 1,2-polybutadienes with a diisocyanate at a temperature of, generally about 40° C. to 120° C., and preferably about 50° C. to 100° C. in an inert gas atmosphere such as nitrogen gas in the presence or absence of a catalysts in a mole ratio of OH/NCO <1 or OH/NCO >1. The catalyst include, for example, tertiary amines such as N,N-dimethylbenzyl amine, N,N-dimethyllaurylamine and triethylene diamine (diazabicyclooctane), and organo-heavy-metal compounds soluble in the reaction system such as ferrous acetoacetate, dibutyltin dilaurate, dibutyltin di-2-hexoate, stannous oleate and stannous octoate.

When the chain extending reaction is effected in a mole ratio of OH/NCO <1, the terminals of the chain extended hydrogenated 1,2-polybutadienes are isocyanate groups. On the other hand when the chain extending reaction is effected in a mole ratio of OH/NCO >1, the terminals of the chain extended hydrogenated 1,2-polybutadienes are hydroxy groups.

Exemplary diisocyanates which may be employed in the preparation of the chain-extended hydrogenated 1,2-polybutadienes include 2,4-tolylene diisocyanate, 2,6-tolylene diisocyanate, hydrogenated 2,4-tolylene diisocyanate, hydrogenated 2,6-tolylene diisocyanate, m-phenylene diisocyanate, p-phenylene diisocyanate, 1,3-dimethylphenyl-2,4-diisocyanate, 1,3-dimethylphenyl-4,6-diisocyanate, 1,4-dimethyl phenyl-2,5-diisocyanate, 1-chlorophenyl-2,4-diisocyanate, 4,4′-diphenyl diisocyanate, 3,3′-dimethyl-4,4′-diphenyl diisocyanate, 2,4′-diphenyl diisocyanate, 3,3′-dimethoxy-4,4′-diphenylmethane diisocyanate, 3,3′-dimethyl-4,4′-diphenylmethane diisocyanate, 4,4′-diphenylmethane diisocyanate, 1,4-naphthylene diisocyanate, 1,5-naphthylene diisocyanate, 2,6-naphthylene diisocynate, 2,7-naphthylene diisocyanate, p-xylylene diisocyanate, m-xylylene diisocyanate, 1,4-tetramethylene diisocyanate, 1,5-pentamethylene diisocyanate, 1,6-hexamethylene diisocyanate, 1,7-heptamethylene diiscyanate, 1,8-octamethylene diisocyanate, 1,9-nonamethylene diisocyanate, 1,10-decamethylene diisocyanate, 2,2,4-trimethyl-1,5-pentamethylene diisocyanate, 2,2′-dimethyl-1,5-pentamethylene diisocyanate, 3-methoxy-1,6-hexamethylene diisocyanate, 3-butoxy-1,6-hexamethylene diisocyanate, ω,ω′-dipropylether diisocyanate, 1,4-cyclohexyl diisocyanate, 1,3-cyclohexyl diisocyanate and mixtures of these diisocyanates.

The number average molecular weight of the prepolymer and the total number of urethane bonds which are present in the chain extended hydrogenated 1,2-butadiene affect the properties of photopolymerized articles. According to this invention the number average molecular weight of the prepolymer is in the range of from about 2,000 to 30,000, and preferably 2,500 to 25,000. When the number average molecular weight is below 2,000, especially the rubber elasticity among mechanical properties of the photopolymerized articles is poor for flexographic printing plates. On the other hand, when the number average molecular weight is above 30,000 the rubber elasticity is superior but the viscosity of the photosensitive composition containing such a prepolymer remarkably increases, and as a result the workability such as processability and developability of photosensitive compositions diminishes extremely. As the total number of the urethane bonds increases the rubber elasticity of the photopolymerized articles becomes improved but the solvent resistance tends to diminish. Thus, the total number of the urethane bonds according to this invention is in the range of from 2 to 20 in order to produce flexographic printing plates having good balance between rubber elasticity and solvent resistance.

Thus, the number average molecular weight of the hydrogenated 1,2-polybutadienes which may be employed in this invention is in the range of about 1,800 to 29,800, and when chain extended hydrogenated 1,2-polybutadienes are prepared the range of the number average molecular weights of the hydrogenated 1,2-polybutadienes is from about 500 to 5,000 and preferably from about 1,000 to 4,000.

Examples of suitable polymerizable ethylenically unsaturated monomeric compounds include:

(1) Compounds of the formula

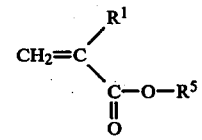

wherein $R^1$ represents a hydrogen atom or methyl group, $R^5$ represents an alkyl group having 1 to 20 carbon atoms, cyclohexyl, alkoxyalkyl group having at most 15 carbon atoms, cyanoalkyl group having at most 8 carbon atom, tertiary amino alkyl group having at most 18 carbon atoms, a hydrogen atom, an oxyalkylene group of

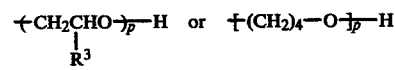

wherein $R^3$ represents a hydrogen atom, methyl, monochloromethyl or mono-bromemethyl group, p represents an integer of 1 to 20, $-(CH_2)_q-$ OH group wherein q is an integer of 5 to 20, $-CH_2C(CH_2)_2CH_2OH$ group or $-CH_2C(CH_2Br)_2CH_2OH$ group;

(2) Compounds of the formula

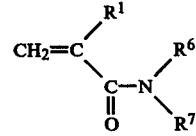

wherein $R^1$ represents a hydrogen atom or methyl group, $R^6$ and $R^7$, each represents a hyrogen atom, alkyl group having 1 to 12 carbon atoms, cyclohexyl, benzyl, $-R^8-OH$ in the case of $R^6$ being a hydrogen atom, wherein $R^8$ represents an alkylene group having 1 to 12 carbon atoms;

(3) Compounds of the formula

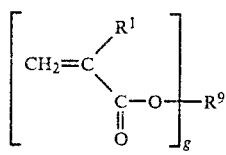

wherein

R¹ represents a hydrogen atom or methyl group, g is an integer of 2 to 4,

R⁹ represents a radical of a polyol having g terminal hydroxy groups and number average molecular weight of at most 1,000;

(4) Compounds of the formula

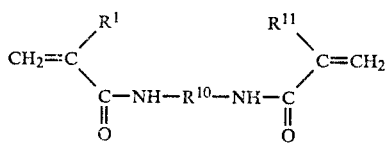

wherein

R¹ and R¹¹, each represents a hydrogen atom or methyl group,

R¹⁰ represents an alkylene group having 1 to 6 carbon atoms;

(5) Compounds of the formula

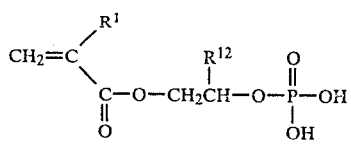

wherein

R¹ represents a hydrogen atom or methyl group,

R¹² represents a hydrogen atom, methyl group, monochloromethyl or monobromomethyl group;

(6) Aromatic compounds having at least one

group and one benzene nucleus;

(7) Heterocyclic compounds having one ethylenically unsaturated group; and (8) Other ethylenically unsaturated monomeric compounds.

Exemplary compounds (1) include methyl acrylate or methacrylate, ethyl acrylate or methacrylate, isopropyl acrylate or methacrylate, n-butyl acrylate or methacrylate, n-pentyl acrylate or methacrylate, neopentyl acrylate or methacrylate, dibromoneopentyl acrylate or methacrylate, n-hexyl acrylate or methacrylate, n-octyl acrylate or methacrylate, n-decyl acrylate or methacrylate, isodecyl acrylate or methacrylate, lauryl acrylate or methacrylate, stearyl acrylate or methacrylate, 2-ethylhexyl acrylate or methacrylate, cyclohexyl acrylate or methacrylate, methoxymethyl acrylate or methacrylate ethoxybutyl acrylate or methacrylate, 2-methoxypropyl acrylate or methacrylate, n-butoxymethyl acrylate or methacrylate; cyanomethyl acrylate or methacrylate, cyanobutyl acrylate or methacrylate; (N,N-dimethylamino) methyl acrylate or methacrylate, 2-(N,N-dimethylamino) ethyl acrylate or methacrylate, 2-(N,N-diethylamino) ethyl acrylate or methacrylate, 2-(N,N-dibenzylamino) ethyl acrylate or methacrylate, 2-(N,N-diethylamino) propyl acrylate or methacrylate; acrylic acid, methacrylic acid, and the same compounds (1) as described before.

Exemplary compounds (2) include acrylamide, methacrylamide, N,N-dimethyl acrylamide or methacrylamide, N,N-diethyl acrylamide or methacrylamide, N,N-diisopropyl acrylamide or methacrylamide, N,N-dodecyl acrylamide or methacrylamide, N-isopropyl acrylamide or methacrylamide, N-cyclohexyl acrylamide or methacrylamide, N-benzyl acrylamide or methacrylamide, N-methylol acrylamide or methacrylamide, 2-hydroxyethyl acrylamide or methacrylamide, 2-hydroxypropyl acrylamide or methacrylamide, 4-hydroxy-n-butyl acrylamide or methacrylamide and the products obtained by ester-amide exchange reaction between methyl acrylate or methacrylate and an amino alcohol having at most 12 carbon atoms.

Exemplary compounds (3) include ethyleneglycol di-acrylate or -methacrylate, diethyleneglycol di-acrylate or-methacrylate, triethyleneglycol di-acrylate or -methacrylate, tetraethyleneglycol di-acrylate or -methacrylate, polyethyleneglycol (number average molecular weight: 200 to 1,000) di-acrylate or -methacrylate, propyleneglycol di-acrylate or -methacrylate, dipropyleneglycol di-acrylate or -methacrylate, polypropyleneglycol (number average molecular weight: 100 to 1,000) di-acrylate or -methacrylate, butyleneglycol di-acrylate or -methacrylate, trimethyloiethane tri-acrylate or -methacrylate, trimethylolpropane tri-acrylate or -methacrylate, pentaerythritol tetra-acrylate or -methacrylate, neopentyl glycol di-acrylate or -methacrylate, dibromoneopentyl glycol di-acrylate or -methacrylate, 1,8-octanediol di-acrylate or -methacrylate, 1,9-nonanediol di-acrylate or -methacrylate, 1,10-decanediol di-acrylate or -methacrylate, 1,12-dodecanediol di-acrylate or -methacrylate and 1,18-octadecanediol di-acrylate or -methacrylate, etc.

Exemplary compounds (4) include N,N'-methylenebisacrylamide, N,N'-methylenebis-methacrylamide, N,N'-trimethylenebisacrylamide, N,N'-trimethylenebismethacrylamide, N,N'-hexamethylenebisacrylamide and N,N'-hexamethylenebismethacrylamide, etc.

Exemplary compounds (5) include 2-acid phosphoxyethyl acrylate or methacrylate, 3-chloro-2-acid phosphoxypropyl acrylate or methacrylate and 3-bromo-2-acid phosphoxypropyl acrylate or methacrylate, etc.

Exemplary compounds (6) include styrene, alpha-methylstyrene, alpha-chlorostyrene, p-tert-butylstyrene, p-sec-butylstyrene, aminostyrene, methoxystyrene, vinyltoluene, vinylbenzoic acid, vinylphenol, allylbenzene, allyltoluene, monoallylphthalate, diallylphthalate, divinylbenzene, etc.

Exemplary compounds (7) include N-vinylcarbazole, N-vinylpyrrolidone, 2-vinylpyridine, 4-vinylpyridine, vinylquinoline, 2-vinylimidazole, 4-vinylimidazole, 5-vinylimidazole, 2-vinylbenzimidazole, N-vinyltetrazole, 2-vinylprazine, 2-vinylthiazole, N-vinyloxazolidone, 2-vinylbenzoxazole, 2-vinylfuran, 2-isopropenylfuran and 2-vinylthiophene.

Exemplary compounds (8) include vinylacetate, vinylpropionate, vinyllaurate, methylvinyl benzoate, beta-hydroxyethyl vinyl benzoate, vinyl succinate, vinyl adipate, divinylphthalate, divinylterephthalate, diphenylpropane derivatives such as 2,2'-bis (4-methacryloxydiethoxyphenyl) propane, 2,2'-bis (4-acryloxydiethoxyphenyl) propane, 2,2'-bis (4-methacryloxyethoxyphenyl) propane and 2,2'-bis (4-acryloxyethoxyphenyl) propane; acrylonitrile; oligoesters having terminal ethylenically unsaturated groups and a number average molecular weight of at most about 1,000 obtained by reacting ethylene glycol, propylene glycol, polyoxyethylene diol having a number average molecular weight of at most about 400 or polyoxypropylene diol having a number average molecular weight of at most about 400 or a mixture thereof with a dicarboxylic acid or its mixture as described in the preparation of the prepolymer (IV) and subsequently reacting the resulting oligoester with a carboxylic acid or dicarboxylic acid as described in the preparation of the prepolymer (I), and the same alcohols (ii) as described afore.

Of these compounds a compound of the formula

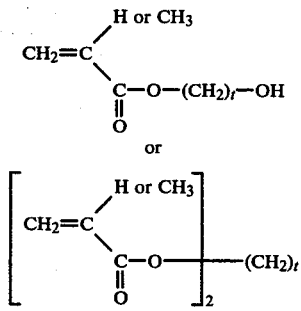

wherein t is an integer of 8 to 20 is especially effective for improving the solvent resistance of photopolymerized articles.

The amount and kind of the polymerizable ethylenically unsaturated monomeric compounds are suitably selected depending upon the properties of photopolymerized articles in accordance with their use and the processability of the photosensitive compositions containing such monomeric compounds. Typically the amount is in the range of about 5 to 100 parts by weight, and preferably 20 to 70 parts by weight based on 100 parts by weight of the prepolymer.

It is necessary that the reaction of photosensitive compositions is initiated only by the action of actinic light and that they are thermally stable. Therefore, preferably polymerization initiators are thermally inactive below 40° C. and initiate photopolymerization upon irradiation with actinic light.

Exemplary photopolymerization initiators include benzoins such as benzoin, benzoin methyl ether, benzoin ethyl ether, benzoin n-propyl ether, benzoin isopropyl ether, benzoin n-butyl ether, benzoin isobutyl ether, benzoin sec-butyl ether, benzoin n-amyl ether, benzoin isoamyl ether, alpha-methylbenzoin, alpha-ethylbenzoin, alpha-methyl benzoin methyl ether, alpha-phenylbenzoin, alpha-alkylbenzoin; anthraquinones such as anthraquinone, chloroanthraquinone, methylanthraquinone, ethyl-anthraquinone, tertiary butyl-anthraquinone; diketones such as benzil, diacetyl; phenones such as acetophenone, benzophenone, omega-bromoacetophenone; 2-naphthalene sulfonyl chloride; disulfides such as diphenyl disulfide, tetraethylthiouram disulfide; dyes such as Eosine G (C.I. 45380) and Thionine (C.I. 52025); and the like.

These photopolymerization initiators are typically used in an amount of from about 0.001 to 10 weight percent, and preferably about 0.01 to 5 weight percent of the total weight of the prepolymer and the polymerizable ethylenically unsaturated monomeric compound.

Knows stabilizers are employed for the purpose of maintaining storage stability (shelf life) of the photosensitive compositions. Such stabilizers may be added when the components of a photosensitive composition are admixed or may be added to each component separately prior to admixing of the components.

Exemplary stabilizers include hydroquinone, monot-ert-butyl hydroquinone, 2, 5-di-tert-butyl hydroquinone, catechol, tert-butyl catechol, 2, 6-di-tert-butyl cresol, benzoquinone, 2, 5-diphenyl-p-benzoquinone, p-methoxy phenol, picric acid and di-p-fluorophenylamine.

These stabilizers are added only for preventing thermal polymerization without the actinic radiation set forth above without restraining the photopolymerization reaction. Consequently the amount of the stabilizers may be about 0.001 to 2.0 percent by weight, and preferably about 0.005 to 1.0 percent by weight of the total weight of the prepolymer and the polymerizable ethylenically unsaturated monomeric compound.

Furthermore, various compounds may be incorporated into the photosensitive compositions in order to adjust the viscosity of photosensitive composition, the mechanical properties and the solvent resistance after photopolymerization in an amount of about 0.01 to 100 parts by weight based on 100 parts by weight of the photosensitive composition. These compounds include, for example, dioctylphthalate, butylphthayl butylene glycolate, polyester type plasticizers, epoxy type plasticizers, various phosphates and polyethers such as polypropylene glycol, process oil, liquid paraffin, liquid rubber such as butyl rubber, butadiene rubber, SBR and NBR, depolymerized natural rubber, unsaturated polyester, alkyd resin and unsaturated polyurethane.

The photosensitive compositions of this invention are photopolymerized by actinic radiation having wave lengths of 2,000 to 8,000 Angstroms. Practical sources of such actinic radiation include carbon arc lamps, super high pressure mercury lamps, high pressure mercury lamps, low pressure mercury lamps, xenon lamps, ultra violet fluorescent lamps and sunlight.

When the photosensitive compositions of this invention are exposed to actinic light through a process transparency, e.g., a negative or positive film, the areas corresponding to the transparent image portions are photopolymerized in about 10 seconds to 60 minutes and the non-image areas, i.e. unexposed areas, remain substantially unphotopolymerized. These non-exposed areas may be washed away with a solvent liquid such as water, an aqueous solution, an aqueous surfactant solution or an organic solvent. Exemplary solvent liquids include aqueous solutions of sodium hydroxide, potassium hydroxide, calcium hydroxide, ammonium hydroxide, sodium carbonate, sodium bicarbonate, potassium carbonate, hydrochloric acid, sulfuric acid, nitric acid, acetic acid; aqueous solutions of methanol, ethanol, isopropanol and acetone; methanol, ethanol, isopropanol, acetone, methylethyl ketone, ethyl acetate, butyl acetate, dioxane, tetrahydrofuran, phenol, ether, n-hexane, benzene, toluene, gasoline, kerosene, light oil, 1,1,1-trichloroethane trichloroethylene tetrachloroethylene or mixtures thereof; an aqueous solution of surfactants such as anionic, cationic, amphoteric or nonionic surfactants.

For example, a relief printing plate may be prepared by placing a process transparency, e.g., a negative film, on a glass sheet transparent to actinic light, covering the negative film with a film transparent to actinic light such as polyester film, depositing the photosensitive composition upon the film to form a layer of about 0.4 mm to 10 mm. in thickness, placing a base or support material such as polyester film on the layer according to the process and apparatus described in German DOS Pat. No. 2,029,238, putting a glass sheet transparent to actinic light on the support material, exposing the resulting assembly to actinic light, first from the support material side, second from the negative film side or simultaneously from the support material side and the negative film side or from the negative film side in case of metal support materials or opaque support materials, removing the glass sheets, the negative film and the film covering the negative film from the assembly, washing out the unexposed portions of the layer, drying the resulting relief printing plate and, if necessary, postexposing the whole relief printing plate.

Examples of suitable base or support materials include metals such as steel and aluminum plates, sheets and foils and plastics such as polyester, polyamide, polyvinylchloride, polyvinylidenechloride, polymethylmethacrylate, polystyrene and cellulose ester films and plates. These support materials may be either transparent or opaque to actinic light. The thickness of these support materials is preferably in the range of 0.1 mm. to 2.0 mm. for metal plates, sheets and foils and preferably in the range of 50 microns to 2 mm. for plastic films and plates.

In the above described method of producing relief printing plates the use of a base or support material may be omitted. In such a case the resulting reliefe printing plate may be used by backing with an elastomeric substance such as rubber as well as the above described base or support material.

The flexographic printing plates which are obtained from the photosensitive compositions according to this invention have superior ink resistance, especially to solvent type ink of flexographic printing as well as good ink transferability and printing reproducibility. When a film printing or a paperbacks printing is run using solvent type flexographic ink the printing durability is more than 500,000 prints. Furthermore, the printing plates which have superior water resistance do not suffer any change in their properties by environmental humidity.

The photosensitive compositions of this invention have a wide range of use as elastomeric substances obtainable by the action of actinic light such as paints, coating material, adhesives, films, sheets, impregnants, photoresists for printing circuit bases and other shaped articles other than reliefe image.

The present invention may be understood more readily from the following non-limiting examples.

SYNTHESIS 1

220 g. of hydrogenated 1,2-polybutadiene having 1.7 terminal hydroxy groups as average per molecule, a number average molecular weight of 2,200 and a hydrogenation ratio of 95% ("GI 2000" trademark, made by Nippon Soda K.K.) were reacted with 22.2 g. of a mixture of 2,4-tolylene diisocyanate and 2,6-tolylene diisocyanate in a weight ratio of 3 to 2 at 60° C. for 3 hours under a nitrogen atmosphere with stirring. Then to the resulting polymer having terminal isocyanates there was added a mixture of 12 g. of 2-hydroxyethyl methacrylate, 0.3 g. of hydroquinone and 0.6 g. of dibutyltin dilaurate and the resulting mixture was subjected to reaction at 80° C. for 2 hours to give a prepolymer having a number average molecular weight of about 7,300.

SYNTHESIS 2

320 g. of hydrogenated 1,2-polybutadiene having 1.5 terminal hydroxy groups as average per molecule, a number average molecular weight of 3,200 and a hydrogenation ratio of 91% ("GI 3000" trademark, made by Nippon Soda K.K.) were reacted with 15.1 g. of hexamethylene diisocyanate at 60° C. for 4 hours under a nitrogen atmosphere with stirring. Then to the resulting polymer having terminal isocyanates there was added a mixture of 7 g. of 2-hydroxypropyl acrylate, 0.3 g. of hydroquinone and 0.6 g. of dibutyltin dilaurate, and the resulting mixture was subjected to reaction at 80° C. for 3 hours to give a prepolymer having a number average molecular weight of about 20,500.

SYNTHESIS 3

In a one liter Parr reactor there were charged 165 ml. of dioxane and 56 g. of 1-butene were introduced therein and polymerization was carried out in the presence of t-butyl-$\beta$-hydroxyethyl peroxide at 120° C. for 3 hours. Then the resulting polymer was precipitated in methanol, separated and further dissolved in n-hexane, precipitated in methanol and separated to give a poly-1-butene having 1.8 terminal hydroxy groups as average per molecule and a number average molecular weight of about 4,000.

200 g. of this poly-1-butene were reacted with 41.7 g. of a mixture of 2,4-tolylene diisocyanate and 2,6-tolylene diisocyanate in a weight ratio of 3 to 2 at 60° C. for 2 hours under a nitrogen atmosphere with stirring. Then to the resulting polymer having terminal isocyanates there was added a mixture of 46 g. of 2-hydroxypropyl methacrylate, 0.1 g. of hydroquinone and 0.05 g. of dibutyltin dilaurate and the resulting mixture was subjected to reaction at 80° C. for 4 hours to give a prepolymer having a number average molecular weight of about 8,300.

SYNTHESIS 4

215 g. of poly-1-butene having 1.9 terminal hydroxy groups as average per molecule and a number average molecular weight of about 4,300 obtained in the same manner as in SYNTHESIS 3 were mixed with 14.4 g. of diphenylmethane diisocyanate, and the mixture was subjected to reaction at 70° C. for 3 hours under a nitrogen atmosphere with stirring. Then to the resulting polymer having terminal isocyanate groups there were added 7 g. of 6-hydroxyethyl methacrylate, 0.1 g. of hydroquinone and 0.6 g. of dibutyltin dilaurate, and the resulting mixture was subjected to reaction at 80° C. for 3 hours to give a prepolymer having a number average molecular weight of about 23,000.

SYNTHESIS 5

300 g. of poly-1-butene having 1.8 terminal hydroxy groups as average per molecule and a number average molecular weight of about 1,500 obtained in the same manner as in SYNTHESIS 3 were mixed with 64.8 g. of a mixture of hydrogenated 2,4-tolylene diisocyanate and 2,6-tolylene diisocyanate in a weight ratio of 3 to 2, and 0.3 g. of dibutyltin diluarate was added thereto. The resulting mixture was subjected to reaction at 80° C. for 3 hours under a nitrogen atmosphere with stirring. Then to the resulting polymer having terminal isocyanate groups there were added 77.7 g. of 2-hydroxypropyl methacrylate and 0.08 g. of hydroquinone and the mixture was subjected to reaction at 80° C. for 2 hours to give a prepolymer having a number average molecular weight of about 2,100.

SYNTHESIS 6

220 g. of hydrogenated 1,2-polybutadiene having 1.6 terminal hydroxy groups as average per molecule, a number average molecular weight of 2,200 and a hydrogenation ratio of 97% ("HPBG 2000" trademark, made by Shin Nippon Rika K.K.), 13.8 g. of methacrylic acid, 0.05 g. of hydroquinone and 0.1 g. of p-toluenesulfonic acid were charged in a one liter flask and stirred. The reaction was carried out at about 80° C. under reduced pressure by introducing dry air into the flask. When the acid value became almost zero the content of the flask was taken out from the flask to give about 230 g. of a prepolymer having a number average molecular weight of about 2,300.

SYNTHESIS 7

(A) Preparation of 1,2-polybutadiene having terminal hydroxy groups

In a 1.5 liter flask there were charged 100 g. of tetrahydrofuran and 200 mg. of o-terphenyl, and the mixture was stirred and the air in the flask was replaced with nitrogen gas. Then a sodium dispersion having an average particle diameter of 8.9 microns obtained by mixing purified kerosene as a dispersing agent, linoleic acid dimer as a dispersion stabilizer and sodium in a concentration of 50% by weight at 110° C. for 30 minutes at a speed of 10,000 r.p.m. was added thereto in an amount of 2 g. as sodium. The dark reddish brown solution thus formed was cooled to −50° C. and 2.7 g. of butadiene was introduced therein over a period of 4 hours to give a dark green solution of butadiene dimer dianion. Then the temperature of this solution was adjusted to −30° C. and 500 g. of butadiene were introduced therein to give a dark green viscous solution. Then excess amount of ethylene oxide was introduced in the resulting solution in 2 minutes while maintaining the reaction temperature of −30° C. to give a polymer having terminal hydroxy groups. After removing the solvent by distillation under reduced pressure there were obtained 490 g. of 1,2-polybutadiene having 1.7 terminal hydroxy groups as average per molecule and a number average molecular weight of about 27,000.

$$\text{Average number of terminal hydroxy group per molecule} = \frac{\overline{M}n \times OHV}{56.1 \times 10^3}$$

$\overline{M}n$: number average molecular weight
$OHV$: hydroxy group value (KOHmg./g.)

(B) Hydrogenation of 1,2-polybutadiene having terminal hydroxy groups 80 parts by weight of 1,2-polybutadiene having terminal hydroxy groups and 20 parts by weight of anhydrous tetrahydrofuran were thoroughly mixed, and one percent by weight, based on the weight of the 1,2-polybutadiene, of stabilized nickel ("Stabilized Nickel N 103", made by Nikki Kagaku K.K.) was added thereto, and then hydrogen was introduced thereto under a pressure of 50 to 60 Kg./cm². at 160° C. for 4 to 8 hours while restoring the pressure of hydrogen to 50 to 60 Kg./cm². whenever the pressure decreased to 10 Kg./cm². The hydrogenation was terminated when the decreasing ratio of hydrogen pressure became less than 1 Kg./cm²./30 minutes, and the reaction mixture was cooled to room temperature and tetrahydrofuran was added thereto to obtain a 20% polymer solution. Then active clay was added to the resulting solution, and the mixture was subjected to filtration and the filtrate was distilled firstly at 80° C. under atmospheric pressure and secondly at 120° C. under reduced pressure to give hydrogenated 1,2-polybutadiene having terminal hydroxy groups.

$$\text{Hydrogenation ratio} = \left(1 - \frac{\text{Iodine value of hydrogenated polymer}}{\text{Iodine value of unhydrogenated polymer}}\right) \times 100$$

Using this hydrogenation method the 1,2-polybutadiene having terminal hydroxy groups obtained in (A) was hydrogenated to give hydrogenated 1,2-polybutadiene having a hydrogenation ratio of 95%.

270 g. of this hydrogenated 1,2-polybutadiene were thoroughly mixed with 1.2 g. of itaconic anhydride, 0.02 g. of p-toluenesulfonic acid and 0.2 g. of hydroquinone, and the mixture thus obtained was subjected to reaction at 130° C. for 3 hours and subsequently at 150° C. for 10 hours with stirring to give a prepolymer.

SYNTHESIS 8

320 g. of hydrogenated 1,2-polybutadiene having 1.5 terminal hydroxy groups as average per molecule, a number average molecular weight of about 3,200 and a hydrogenation ratio of 91% obtained by hydrogenating 1,2-polybutadiene having 1.5 terminal hydroxy groups as average per molecule and a number average molecular weight of 3,000 ("PBG 3000" trademark, made by Nippon Soda K.K.) in the same manner as in SYNTHESIS 7(B) were mixed with 8.7 g. of a mixture of 2,4-tolylene diisocyanate and 2,6-tolylene diisocyanate in a weight ratio of 3 to 2, and the resulting mixture was subjected to reaction at 60° C. for 4 hours under a nitrogen atmosphere with stirring to give a prepolymer having terminal hydroxy groups and a number average molecular weight of about 20,000.

200 g. of the resulting polymer were thoroughly mixed with 1.2 g. of itaconic anhydride, 0.02 g. of p-toluenesulfonic acid and 0.2 g. of hydroquinone and the resulting mixture was subjected to reaction at 130° C. for 3 hours and at 150° C. for 10 hours with stirring to give a prepolymer.

SYNTHESIS 9

220 g. of hydrogenated 1,2-polybutadiene having 1.7 terminal hydroxy groups as average per molecule, a number average molecular weight of about 2,200 and a hydrogenation ratio of 95% obtained by hydrogenating 1,2-polybutadiene having 1.7 terminal hydroxy groups as average per molecule and a number average molecular weight of 2,000 ("PBG 2000" trademark, made by Nippon Soda K.K.) in the same manner as in SYNTHESIS 7(B) were mixed with 22.6 g. of m-phenylene diisocyanate and the resulting mixture was subjected to reaction at 60° C. for 3 hours under a nitrogen atmosphere with stirring to give 242.6 g. of a polymer having terminal isocyanate groups and a number average molecular weight of about 7,000. Then the resulting polymer was further reacted with 12 g. of 2-hydroxyethyl methacrylate in the presence of 0.3 g. of hydroquinone and 0.6 g. of dibutyltin dulaurate at 80° C. for 2 hours to give a prepolymer having a number average molecular weight of about 7,300.

SYNTHESIS 10 (Comparative)

300 g. of 1,2-polybutadiene having 1.6 terminal hydroxy groups as average per molecule and a number average molecular weight of 3,000 ("PBG 3000" trademark, made by Nippon Soda K.K.) were mixed with 20.9 g. of a mixture of 2,4-tolylene diisocyanate and 2,6-tolylene diisocyanate in a weight ratio of 3 to 2, and the resulting mixture was subjected to reaction at 60° C. for 3 hours under a nitrogen atmosphere with stirring. Then to the resulting polymer having terminal isocyanate groups there was added a mixture of 98 g. of 2-hydroxyethyl methacrylate 0.3 g. of hydroquinone and 0.6 g. of dibutyltin dilaurate, and the resulting mixture was subjected to reaction at 80° C. for 4 hours to give a prepolymer having a number average molecular weight of about 6,800.

SYNTHESIS 11

220 g. of hydrogenated 1,2-polybutadiene having 1.7 terminal hydroxy groups as average per molecule, a number average molecular weight of about 2,200 and a hydrogenation ratio of 43% obtained by hydrogenating 1,2-polybutadiene having 1.7 terminal hydroxy groups as average per molecule, a number average molecular weight of 2,000 ("PBG 2000" trademark, made by Nippon Soda K.K.) in the same manner as in SYNTHESIS 7(B) were mixed with 22.2 g. of a mixture of 2,4-tolylene diisocyanate in a weight of 3 to 2, and the resulting mixture was subjected to reaction at 60° C. for 4 hours under a nitrogen atmosphere with stirring to give 242.2 g. of a polymer having terminal isocyanate groups and a number average molecular weight about 7,000. Then the resulting polymer was further reacted with 12 g. of 2-hydroxyethyl methacrylate in the presence of 0.3 g. of hydroquinone and 0.6 g. of dibutyltin dilaurate at 80° C. for 2 hours to give a prepolymer having a number average molecular weight of about 7,200.

SYNTHESIS 12 (Comparative)

130 g. of hydrogenated 1,2-polybutadiene having 1.9 terminal hydroxy groups as average per molecule, a number average molecular weight of about 1,300 and a hydrogenation ratio of 98% obtained by hydrogenating 1,2-polybutadiene having 1.9 terminal hydroxy groups as average per molecule and a number average molecular weight of 1,300 ("PBG 1000" trademark, made by Nippon Soda K.K.) in the same manner as in SYNTHESIS 7(B) were mixed with 35 g. of a mixture of 2,4-tolylene diisocyanate and 2,6-tolylene diisocyanate in a weight ratio of 3 to 2, and the resulting mixture was subjected to reaction at 60° C. for 2 hours under a nitrogen atmosphere with stirring to give 265 g. of a prepolymer having terminal isocyanate groups and a number average molecular weight of about 1,600. Then the resulting polymer was further reacted with 70 g. of 2-hydroxyethyl methacrylate in the presence of 0.3 g. of hydroquinone and 0.6 g. of dibutyltin dilaurate at 80° C. for 3 hours to give 335 g. of a prepolymer having a number average molecular weight of about 1,900.

SYNTHESIS 13

220 g. of the same hydrogenated 1,2-polybutadiene as in SYNTHESIS 9 were mixed with 22.2 g. of a mixture of 2,4-tolylene diisocyanate and 2,6-tolylene diisocyanate in a weight ratio of 3 to 2 and the resulting mixture was subjected to reaction at 60° C. for 3 hours under a nitrogen atmosphere with stirring to give 242.2 g. of a polymer having terminal isocyanate groups and a number average molecular weight of about 7,000. Then the resulting polymer was further reacted with 12 g. of 2-hydroxyethyl methacrylate in the presence of 0.3 g. of hydroquinone and 0.6 g. of dibutyltin dilaurate at 80° C. for 2 hours to give a prepolymer having a number average molecular weight of about 7,300.

SYNTHESIS 14

220 g. of the same hydrogenated 1,2-polybutadiene as in SYNTHESIS 9 were mixed with 37.6 g. of 3,3'-dimethyl-diphenylmethane diisocyanate and the resulting mixture was subjected to reaction at 60° C. for 5 hours under a nitrogen atmosphere with stirring to give 257.6 g. of a polymer having terminal isocyanate groups and a number average molecular weight of about 10,000. Then the resulting polymer was further reacted with 12 g. of 2-hydroxyethyl methacrylate in the presence of 0.3 g. of hydroquinone and 0.6 g. of dibutyltin dilaurate at 80° C. for 2 hours to give a prepolymer having a number average molecular weight of about 10,200.

SYNTHESIS 15

320 g. of the same hydrogenated 1,2-polybutadiene as in SYNTHESIS 8 were mixed with 15.1 g. of hexamethylene diisocyanate and the mixture was subjected to reaction at 60° C. for 4 hours under a nitrogen atmosphere with stirring to give 335.1 g. of a polymer having terminal isocyanate groups and a number average molecular weight of about 17,000. Then the resulting polymer was further reacted with 7 g. of 2-hydroxypropyl acrylate in the presence of 0.3 g. of hydroquinone and 0.6 g. of dibutyltin dilaurate at 80° C. for 3 hours to give a prepolymer having a number average molecular weight of about 17,600.

SYNTHESIS 16 (Comparative)

320 g. of the same hydrogenated 1,2-polybutadiene as in SYNTHESIS 8 were mixed with 14.4 g. of a mixture of 2,4-tolylene diisocyanate and 2,6-tolylene diisocyanate in a weight ratio of 3 to 2, and the resulting mixture was subjected to reaction at 60° C. for 6 hours under a nitrogen atmosphere with stirring to give 334.4 g. of a polymer having terminal isocyanate groups and a number average molecular weight of about 34,000. Then the resulting polymer was further reacted with 4 g. of 2-hydroxypropyl acrylate in the presence of 0.3 g. of hydroquinone and 0.6 g. of dibutyltin dilaurate at 80° C. for 3 hours to give a prepolymer having a number average molecular weight of about 34,400.

SYNTHESIS 17

The same procedure as in SYNTHESIS 7(A) was repeated except that 800 g. of butadiene was employed instead of 500 g. of butadiene and there were obtained 770 g. of 1,2-polybutadiene having 1.5 terminal hydroxy groups as average per molecule and a number average molecular weight of about 43,000.

Then this 1,2-polybutadiene was hydrogenated in the same manner as in SYNTHESIS 7(B) to give hydrogenated 1,2-polybutadiene having a hydrogenation ratio of 95%.

430 g. of this hydrogenated 1,2-polybutadiene were thoroughly mixed with 1.2 g. of itaconic anhydride, 0.02 g. of dibutyltin dilaurate and 0.2 g. of hydroquinone and the resulting mixture was subjected to reaction at 130° C. for 3 hours and subsequently at 150° C. for 10 hours with stirring to give a prepolymer.

SYNTHESIS 18 (Comparative)

320 g. of the same hydrogenated 1,2-polybutadiene as in SYNTHESIS 8 were mixed with 263 g. of hydrogenated 1,2-polybutadiene having a number average molecular weight of about 3,000 and a hydrogenation ratio of 91% obtained by hydrogenating 1,2-polybutadiene having no terminal hydroxy groups ("PB 3000" trademark, made by Nippon Soda K.K.) in the same manner as in Example 7(B) to give 583 g. of hydrogenated 1,2-polybutadiene having 0.8 terminal hydroxy group as average per molecule. The resulting hydrogenated 1,2-polybutadiene was mixed with 15.1 g. of hexamethylene diisocyanate, and the mixture was subjected to reaction at 60° C. for 4 hours under a nitrogen atmosphere with stirring to give 598 g. of a polymer having terminal isocyanate group and a number average molecular weight of about 12,500. Then the resulting polymer was further reacted with 7 g. of 2-hydroxypropyl acrylate in the presence of 0.3 g. of hydroquinone and 0.6 g. of dibutyltin dilaurate at 80° C. for 3 hours to give a prepolymer having a number average molecular weight of 12,700.

SYNTHESIS 19

290 g. of hydrogenated 1,2-polybutadiene having 1.5 terminal hydroxy groups as average per molecule, a number average molecular weight of 2,900 and a hydrogenation ratio of 95% ("HPBG 3000" trademark, made by Shin Nippon Rika K.K.) were reacted with 15 g. of succinic anhydride at 100° C. under reduced pressure, and the reaction was continued until the acid value become constant to about 27.6 to give a hydrogenated 1,2-polybutadiene having terminal carboxyl group. Then, 152 g. of the resulting hydrogenated 1,2-polybutadiene was reacted with 10.7 g. of glycidyl methacrylate in the presence of 1 g. of trimethylbenzyl ammonium hydroxide at 80° C. until the acid value became almost zero and there was obtained a prepolymer having a number average molecular weight of about 3,250.

SYNTHESIS 20

190 g. of hydrogenated 1,2-polybutadiene having 1.8 terminal hydroxy groups as average per molecule, a number average molecular weight of 1,900 and a hydrogenation ratio of 97% ("HPBG 2000" trademark, made by Shin Nippon Rika K.K.) were reacted with 13 g. of a mixture of 2,4-tolylene diisocyanate and 2,6-tolylene diisocyanate in a weight ratio of 3 to 2 at 70° C. under a nitrogen atmosphere with stirring until the specific absorptions due to isocyanate group on an infra red chart disappeared. Then, the reaction solution was cooled to room temperature and 4.5 g. of phthalic anhydride were added thereto and the temperature of the mixture was raised to 100° C. to carry out the reaction. Subsequently, to the resulting reaction solution there were added 3.5 g. of allylglycidyl ether, 1 g. of trimethylbenzyl ammonium hydroxide and 0.2 g. of hydroquinone and the mixture was subjected to reaction at 120° C. to give a prepolymer having a number average molecular weight of about 12,000.

EXAMPLE 1

Preparation of photopolymerized articles 100 g. of the prepolymer in SYNTHESIS 1, a variety of ethylenically unsaturated compounds set forth in Table 1, hydroquinone and a photopolymerization initiator set forth in Table 1 were thoroughly mixed to give uniform photosensitive compositions.

On a transparent glass sheet, 5 mm. in thickness, there was placed a spacer, 1 mm. in thickness and then each of the photosensitive compositions was charged thereto, and then a transparent glass sheet, 5 mm. in thickness, was placed on the spacer. The resulting assembly was exposed to a 300 W. high pressure mercury lamp set at a distance of 35 cm. from one side of the glass sheets for 20 minutes, and subsequently the two glass sheets were removed. The properties of the photopolymerized article were measured and the results are shown in Table 1.

Preparation of flexographic printing plate and printing using the same

On a transparent glass sheet, 10 mm. in thickness, there was placed a negative film and the negative film was covered with a polyester film, 9 microns in thickness, and a spacer, 2 mm. in thickness, was placed thereon. Then each of the same photosensitive compositions was charged thereto and a polyester film, 100 microns in thickness, was laminated to the layer of the photosensitive composition and a transparent glass sheet, 5 mm. in thickness, was placed thereon. The resulting assembly was exposed to a 500 W. high pressure mercury lamp set at a distance of about 30 cm. from each of the glass sheets at room temperature, first from the upper glass sheet for about 1 minute, and second from the glass sheet of the negative film side for 5 minutes. After exposure the two glass sheets and the polyester film covering the negative film were removed and the photopolymerized layer on the polyester base film was washed with a 2% aqueous surfactant solution ("Lipponox" trademark, nonion type,

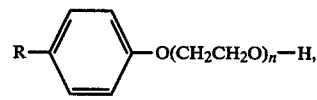

made by Lion Fat & Oil Co., Ltd.) and dried to produce a printing plate for flexographic printing having a relief height of 0.8 mm. and a resolution of 133 lines per inch. Using this printing plate a rotary printing was run on polyester film and high density polyethylene film, respectively with an alcoholic flexographic ink comprising 93% by weight of isopropyl alcohol and 7% by weight of toluene. At least 500,000 clear and precise prints were obtained without any damage of the relief image and without any enlargement of letters. Furthermore, the same procedure of preparing flexographic printing plates using the same photosensitive compositions as described above was repeated except that the thickness of the printing plate was changed to 3 mm. and the relief height was changed to 1.0 mm. Using each of the printing plates a paperbacks printing was run with an alcoholic flexographic ink containing about 10 percent by weight of ethyl acetate, and at least 500,000 clear and precise prints were obtained without observing any damage of the relief image and any enlargement of letters and fine lines.

EXAMPLE 2

Each of the photosensitive compositions set forth in Table 2 was photopolymerized in the same manner as in Example 1 to give photopolymerized articles. The properties of the articles are shown in Table 2. Also using the same photosensitive compositions flexographic printing plates were prepared and rotary printings and paperbacks printings were run using the resulting printing plates in the same manner as in Example 1 to give at least 500,000 clear and precise prints without observing any deformation of the relief image and any enlargement of letters.

EXAMPLE 3

100 g. of each of the prepolymers obtained in Synthesis 7 to 9, 37 g. of lauryl methacrylate, 8 g. of 1,3-butyleneglycol dimethacrylate, 5 g. of polypropyleneglycol dimethacrylate having a number average molecular weight of 676, 0.225 g. of hydroquinone and 4.5 g. of benzoin n-butyl ether were thoroughly mixed to give uniform photosensitive compositions. Each of the resulting photosensitive compositions was photopolymerized in the same manner as in Example 1 to give photopolymerized articles. The properties of the articles are shown in Table 3.

EXAMPLE 4 (Comparative)

100 g. of each of the prepolymer obtained in SYNTHESIS 10 and 11, 30 g. of lauryl methacrylate, 20 g. of polypropyleneglycol dimethacrylate having a number average molecular weight of 676, 0.15 g. of hydroquinone and 3 g. of benzoin methyl ether were thoroughly mixed to give uniform photosensitive compositions. Each of the resulting photosensitive compositions was photopolymerized in the same manner as in Example 1 to give photopolymerized articles. The properties of the articles are shown in Table 4. Also using the same photosensitive compositions flexographic printing plates were prepared and rotary printings were run using the resulting printing plates in the same manner as in Example 1. The results are shown in Table 4 together with the result of Example 1, Run No. 1.

EXAMPLE 5

100 g. of each of the prepolymers obtained in SYNTHESIS 12 to 17, 30 g. of lauryl methacrylate, 8 g. of 1,3-butylene glycol dimethacrylate, 5 g. of polypropyleneglycol dimethacrylate having a number average molecular weight of 676, 0.2 g. of hydroquinone and 4.0 g. of benzoin methyl ether were thoroughly mixed to give uniform photosensitive compositions. Each of the resulting photosensitive compositions was photopolymerized in the same manner as in Example 1 to give photopolymerized articles. The properties of the articles are shown in Table 5. Also using the same photosensitive compositions flexographic printing plates were prepared and rotary printings were run using the resulting printing plates in the same manner as in Example 1. The results are shown in Table 5.

EXAMPLE 6

100 g. of each of the prepolymers obtained in SYNTHESIS 18, 2 and 1, 30 g. of lauryl methacrylate, 8 g. of 1,3-butylene glycol dimethacrylate, 5 g. of polypropyleneglycol dimethacrylate having a number average molecular weight of 676, 0.27 g. of hydroquinone and 4.3 g. of benzoin methyl ether were thoroughly mixed to give uniform photosensitive compositions. Each of the resulting photosensitive compositions was photopolymerized in the same manner as in Example 1 to give photopolymerized articles. The properties of the articles are shown in Table 6. Also using the same photosensitive compositions flexographic printing plates were prepared and rotary printings were run using the resulting printing plates in the same manner as in Example 1. The results are shown in Table 6.

EXAMPLE 7

100 g. of the prepolymer obtained in SYNTHESIS 1, 8 g. of 1,3-butyleneglycol dimethacrylate, 5 g. of polypropyleneglycol dimethacrylate having a number average molecular weight of 676, 30 g. of another polymerizable ethylenically unsaturated monomer set forth in Table 7, 0.15 g. of hydroquinone and 3 g. of benzoin methyl ehter were thoroughly mixed to give uniform photosensitive compositions. Each of the resulting photosensitive compositions was photopolymerized in the same manner as in Example 1 to give photopolymerized articles. The properties of the articles are shown in Table 7.

EXAMPLE 8

100 g. of the prepolymer obtained in SYNTHESIS 1, 30 g. of lauryl methacrylate, 5 g. of polypropyleneglycol dimethacrylate having a number average molecular weight of 676, 8 g. of another ethylenically unsaturated monomer set forth in Table 8, 0.15 g. of hydroquinone and 3 g. of benzoin methyl ether were thoroughly mixed to give uniform photosensitive compositions. Each of the resulting photosensitive compositions was photopolymerized in the same manner as in Example 1 to give photopolymerized articles. The properties of the articles are shown in Table 8.

EXAMPLE 9

100 g. of the prepolymer obtained in SYNTHESIS 19, 40 g. of lauryl methacrylate, 10 g. of 1,3-butylene glycol dimethacrylate, 20 g. of 2,2'-bis(4-methacryloxyethoxyphenyl) propane, 0.1 g. of hydroquinone and 3 g. of benzoin isobutyl ether were thoroughly mixed to give a uniform photosensitive composition. The resulting photosensitive composition was photopolymerized in the same manner as in Example 1 to give a photopolymerized article. The properties of the article are as follows:

| | |
|---|---|
| Shore hardness A | 60 |
| Tensile strength | 60 Kg./cm$^2$. |
| Elongation | 140% |
| Swellability (Isopropyl alcohol) | 10% |

EXAMPLE 10

100 g. of the prepolymer obtained in SYNTHESIS 20, 20 g. of lauryl methacrylate, 10 g. of stearyl methacrylate, 5 g. of N-vinylcarbazole, 15 g. of 2,2'-bis(4-methacryloxydiethoxyphenyl) propane, 0.15 g. of hydroquinone and 2.5 g. of benzoin isopropyl ether were thoroughly mixed to give a uniform photosensitive composition. The resulting photosensitive composition was photopolymerized in the same manner as in Example 1 to give a photopolymerized article. The properties of the article are as follows:

| Shore hardness A | 50 |
|---|---|
| Tensile strength | 65 Kg./cm$^2$. |
| Elongation | 150% |
| Swellability (Isopropyl alcohol) | 9% |

EXAMPLE 11 (Comparative)

600 g. of 1,4-polybutadiene having 2.0 terminal hydroxy groups as average per molecule and a number average molecular weight of 3,000 ("R-45M", trademark, made by Arco Corp.) were mixed with 42 g. of a mixture of 2,4-tolylene diisocyanate and 2,6-tolylene diisocyanate in a weight ratio of 3 to 2 and the resulting mixture was subjected to reaction at 40° C. for 2 hours under a nitrogen atmosphere with stirring. Then to the resulting polymer having terminal isocyanate groups there were added simultaneously 20 g. of 2-hydroxyethyl methacrylate, 0.3 g. of hydroquinone and 0.2 g. of dibutyltin dilaurate and the resulting mixture was subjected to reaction at 85° C. for 4 hours to give a prepolymer having a number average molecular weight of about 16,300.

100 g. of this prepolymer, 20 g. of n-decyl methacrylate, 3 g. of benzoin n-propyl ether and 0.15 g. of hydroquinone were thoroughly mixed to give a uniform photosensitive composition. The resulting photosensitive composition was photopolymerized in the same manner as in Example 1 to give a photopolymerized article. The properties of the article are as follows:

| Shore hardness A | 76 |
|---|---|
| Tensile strength | 72 Kg./cm$^2$. |
| Elongation | 61% |
| Swellability (Isopropyl alcohol) | 18% |

Also using the same photosensitive composition a flexographic printing plate was prepared in the same manner as in Example 1 and a paperbacks printing was run using this printing plate with an alcoholic flexographic ink. Enlargement of letters was observed soon after the printing was initiated, and around about 2,000 prints part of the relief image of the printing plate was broken off due to lowering in mechanical strength caused by swelling.

EXAMPLE 12 (Comparative)

320 g. of butadiene-acrylonitrile copolymer having 1.8 terminal carboxyl group as average per molecule and a number average molecular weight of 3,200 ("Hycar CTBN" trademark, made by B. F. Goodrich Co.), 56 g. of glycidyl methacrylate, 1.4 g of trimethylbenzyl ammonium hydroxide and 0.3 g. of hydroquinone were mixed and the resulting mixture was subjected to reaction at 80° C. for 8 hours with stirring to give a prepolymer. 100 g. of this prepolymer, 30 g. of lauryl methacrylate, 20 g. of diethyleneglycol dimethacrylate, 3 g. of benzoin methyl ether and 0.15 g. of hydroquinone were thoroughly mixed to give a uniform photosensitive composition. The resulting photosensitive composition was photopolymerized in the same manner as in Example 1 to give a photopolymerized article. The properties of the article are as follows:

| Shore hardness A | 55 | |
|---|---|---|
| Tensile strength | 15 Kg./cm$^2$. | |
| Elongation | 100% | |
| Swellability | | |
| Isopropyl alcohol | 20% | |
| Ethyl acetate | 121% | |

Also using the same photosensitive composition a flexographic printing plate was prepared in the same manner as in Example 1. The mechanical strength of the resulting plate was poor and the printing durability was lower than that of Example 1, Run No. 1. Also this printing plate was not suitable for a printing using a solvent type flexographic printing ink as in Example 11.

In the following tables which set out the results of the test on the photopolymerized articles of Example 1 to 8 as well as in Example 9 to 12, the properties were measured as follows:

| Tensile strength: | JIS K6301.3 |
|---|---|
| Elongation : | JIS K6301.3 |

Shore hardness A:
Durometer Type A
Measuring temperature : 20° C.
Sample : 1 mm. (thick) × 10 mm. (broad) × 10 mm. (long)
Five same samples were superimposed and subjected to measurement.
Swellability % : Increase in weight (%) after immersing the photopolymerized articles in isopropyl alcohol or ethyl acetate at 20° C. for 24 hours.

Table 1

| Run No. | Polymerizable ethylenically unsaturated compound (g.) | | Inhibitor (Hydroquinone) (g.) | Photoinitiator (g.) | Properties of photopolymerized article | | | |
|---|---|---|---|---|---|---|---|---|
| | | | | | Shore hardness A | Tensile strength (Kg./cm$^2$.) | Elongation (%) | Swellability (Isopropyl alcohol) (%) |
| 1 | Lauryl methacrylate polypropyleneglycol dimethacrylate ($\overline{Mn}$ = 676) | 30 20 | 0.15 | Benzoin isoamyl ether 3 | 56 | 55 | 150 | 5 |
| 2 | Lauryl methacrylate polypropyleneglycol dimethacrylate ($\overline{M}$ = 676) 1,3-Butyleneglycol dimethacrylate Naphthene process oil | 37 5 8 10 | 0.24 | Benzoin n-butyl ether 4.8 | 50 | 55 | 130 | 3 |
| 3 | Lauryl methacrylate Trimethylolethane tri- | 30 | 0.24 | Benzoin n-butyl | 54 | 58 | 212 | 8 |

Table 1-continued

| Run No. | Polymerizable ethylenically unsaturated compound (g.) | Inhibitor (Hydroquinone) (g.) | Photoinitiator (g.) | Properties of photopolymerized article ||||
|---|---|---|---|---|---|---|---|
| | | | | Shore hardness A | Tensile strength (Kg./cm².) | Elongation (%) | Swellability (Isopropyl alcohol) (%) |
| | methacrylate 2,2'-Bis(4-methacryloxy diethoxyphenyl) propane | 5<br>15 | ether 4.8 | | | | |
| 4 | n-Decyl methacrylate<br>1,9-Nonanediol di-methacrylate | 40<br>10 | 0.23 | Benzoin n-butyl ether 4.5 | 56 | 60 | 120 | 4 |
| 5 | Polypropyleneglycol mono-methacrylate ($\overline{Mn}$ = 380)<br>Trimethylolpropane tri-methacrylate | 40<br>10 | 0.25 | Benzoin n-butyl ether 4.5 | 65 | 68 | 140 | 6 |

Table 2

| Prepolymer (100 g.) Synthesis No. | Photosensitive composition |||| Properties of photopolymerized article ||||
|---|---|---|---|---|---|---|---|---|
| | Polymerizable ethylenically unsaturated monomer (g.) | Inhibitor (Hydroquinone) (g.) | Photoinitiator (g.) | | Shore hardness A | Tensile strength (Kg./cm². | Elongation (%) | Swellability (Isopropyl alcohol) (%) |
| 2 | Stearyl methacrylate<br>Neopentylglycol di-methacrylate | 30<br>20 | 0.15 | Benzoin methyl ether 3 | 50 | 60 | 140 | 4 |
| 3 | n-Nonyl methacrylate<br>Stearyl methacrylate<br>1,3-Butyleneglycol di-methacrylate | 30<br>10<br>10 | 0.15 | Benzoin n-butyl ether 3 | 60 | 70 | 150 | 8 |
| 4 | Lauryl methacrylate<br>Polypropyleneglycol dimethacrylate ($\overline{Mn}$ = 676) | 30<br>20 | 0.15 | Benzoin isopropyl ether 3 | 48 | 60 | 150 | 2 |
| 5 | n-Octyl methacrylate<br>Trimethylolpropane trimethacrylate | 50<br>5 | 0.155 | Benzoin n-butyl ether 3.1 | 55 | 62 | 120 | 6 |
| 6 | Lauryl methacrylate<br>Polypropyleneglycol dimethacrylate ($\overline{Mn}$ = 676)<br>2,2'-Bis (4-methacryloxy-ethoxyphenyl) propane | 30<br>10<br>10 | 0.15 | Benzoin sec-butyl ether 3 | 58 | 50 | 140 | 8 |

Table 3

| Run No. | Prepolymer | Properties of photopolymerized article ||||
|---|---|---|---|---|---|
| | | Shore hardness A | Tensile strength (Kg/cm².) | Elongation (%) | Swellability (Isopropyl alcohol) (%) |
| 1 | Synthesis 7 | 42 | 50 | 150 | 3 |
| 2 | Synthesis 8 | 45 | 58 | 160 | 5 |
| 3 | Synthesis 9 | 52 | 57 | 135 | 4 |

Table 4

| Run No. | Prepolymer hydrogenation ratio (%) | Photoinitiator | Properties of photopolymerized article |||||||
|---|---|---|---|---|---|---|---|---|---|
| | | | Shore hardness A | Tensile strength (Kg./cm².) | Elongation (%) | Swellability || Durability of printing plate (number of prints) |||
| | | | | | | Isopropyl alcohol (%) | Ethyl acetate (%) | 100,000 | 200,000 | 500,000 |
| 1 | Synthesis 10 (Comparative) 0 | Benzoin Methyl-ether | 85 | 58 | 53 | 6 | 30 | | C | |
| 2 | Synthesis 11 (Comparative) 43 | Benzoin methyl-ether | 78 | 53 | 60 | 8 | 28 | | C | |
| Example 1 | Synthesis 1 95 | Benzoin isoamyl | 56 | 55 | 150 | 5 | 23 | | | A |

Table 4-continued

| | | | Properties of photopolymerized article | | | | | | | |
|---|---|---|---|---|---|---|---|---|---|---|
| | Prepolymer | | | | | Swellability | | Durability of | | |
| | hydrogenation | | Shore | Tensile | | Isopropyl | Ethyl | printing plate | | |
| Run | ratio | Photo- | hardness | strength | Elongation | alcohol | acetate | (number of prints) | | |
| No. | (%) | initiator | A | (Kg./cm².) | (%) | (%) | (%) | 100,000 | 200,000 | 500,000 |
| Run No. 1 | | ether | | | | | | | | |

A: At least 500,000 clear and precise prints were obtained without any damage of the relief image.
C: Before obtaining 100,000 prints parts of the relief image were broken off due to lowness in elongation and highness in hardness.

Table 5

| | | | Properties of photopolymerized article | | | | | | | |
|---|---|---|---|---|---|---|---|---|---|---|
| | | | | | | Swellability | | Durability of | | |
| | | | Shore | Tensile | Elon- | Isopropyl | Ethyl | printing plate | | |
| Run | | | hardness | strength | gation | alcohol | acetate | (number of prints) | | |
| No. | Prepolymer ($\overline{M}n$) | | A | (Kg./cm².) | (%) | (%) | (%) | 100,000 | 200,000 | 500,000 |
| 1 | Synthesis 12 (Comparative) | about 1,900 | 75 | 110 | 90 | 6 | 65 | | B | |
| 2 | Synthesis 13 | about 7,300 | 50 | 55 | 130 | 3 | 36 | | | A |
| 3 | Synthesis 14 | about 10,200 | 55 | 60 | 180 | 3 | 35 | | | A |
| 4 | Synthesis 15 | about 17,600 | 46 | 65 | 205 | 5 | 30 | | | A |
| 5 | Synthesis 16 (Comparative) | about 34,400 | 42 | 62 | 210 | 4 | 25 | — | — | — |
| 6 | Synthesis 17 (Comparative) | about 43,300 | 38 | 40 | 180 | 3 | 18 | — | — | — |

A: The same as defined in Table 4.
B: Before obtaining 200,000 prints parts of the relief image were broken off.
—: The viscosity of the photosensitive composition was too high to produce a printing plate in the same method as in Example 1.

Table 6

| | | | Properties of photopolymerized article | | | | | | | |
|---|---|---|---|---|---|---|---|---|---|---|
| | | | | | | Swellability | | Durability of | | |
| | Prepolymer | Shore | Tensile | | Isopropyl | Ethyl | printing plate | | | |
| Run | (Average number of | hardness | strength | Elongation | alcohol | acetate | (number of prints) | | | |
| No. | terminal hydroxy group) | A | (Kg./cm².) | (%) | (%) | (%) | 100,000 | 200,000 | 500,000 | |
| 1 | Synthesis 18 (Comparative) 0.8 | 45 | 32 | 100 | 12 | 52 | | B | | |
| 2 | Synthesis 2 1.5 | 52 | 64 | 130 | 4 | 25 | | | A | |
| 3 | Synthesis 1 1.7 | 54 | 60 | 140 | 5 | 23 | | | A | |

A: The same as defined in Table 4.
B: The same as defined in Table 5.

Table 7

| | | Properties of photopolymerized article | | | |
|---|---|---|---|---|---|
| | Another | Shore | Tensile | | Swellability (Isopropyl |
| Run | polymerizable ethylenically | hardness | strength | Elongation | alcohol) |
| No. | unsaturated monomer | A | (Kg/cm².) | (%) | (%) |
| 1 | 2-Ethylhexyl methacrylate | 57 | 60 | 140 | 4 |
| 2 | Stearyl methacrylate | 50 | 54 | 170 | 4 |
| 3 | 1,8-Octanediol monomethacrylate | 59 | 64 | 120 | 6 |
| 4 | 1,18-Octadecanediol monomethacrylate | 53 | 58 | 163 | 5 |

Table 8

| | | Properties of photopolymerized article | | | |
|---|---|---|---|---|---|
| | Another | | | | Swellability |
| | polymerizable ethylenically | Shore | Tensile | | (Isopropyl |
| Run | unsaturated monomer | hardness | strength | Elongation | alcohol) |
| No. | (g.) | A | (Kg/cm².) | (%) | (%) |
| 1 | 2,2'-Bis (4-methacryloxy-diethoxyphenyl) propane | 52 | 60 | 160 | 2 |
| 2 | N-Vinylcarbazole | 60 | 73 | 130 | 3 |
| 3 | Oligoester having terminal | 50 | 60 | 170 | 4 |

Table 8-continued

| | | Properties of photopolymerized article | | |
|---|---|---|---|---|
| Run No. | Another polymerizable ethylenically unsaturated monomer (g.) | Shore hardness A | Tensile strength (Kg/cm$^2$.) | Elongation (%) | Swellability (Isopropyl alcohol) (%) | ethylenically unsaturated groups*

*Obtained by reacting a 1:1 weight mixture of ethyleneglycol and propyleneglycol with a 4:1 weight mixture of adipic acid and isophthalic acid in a weight ratio of 11 to 10 and subsequently esterifying the resulting oligoester with methacrylic acid.

What is claimed is:

1. A photosensitive composition comprising:
   (I) 100 parts by weight of one prepolymer having terminal ethylenically unsaturated groups and a number average molecular weight of about 2,000 to 30,000 whose main segment is selected from the group consisting of (i) a chain consisting essentially of a hydrogenated 1,2-polybutadiene having two ends per molecule and a hydrogenation ratio of pendent vinyl groups of the 1,2-addition units of about 50 to 100 percent, about 1.2 to 2 of such ends per molecule carrying hydroxy groups, (ii) a residue consisting essentially of a chain extended hydrogenated 1,2-polybutadiene having 2 to 20 urethane bonds obtained by reaction between the hydrogenated 1,2-polybutadiene and a diisocyanate, (iii) a chain consisting essentially of a hydrogenated 1,2-polybutadiene having two ends per molecule and carboxyl groups at such ends introduced by esterification between the hydroxy groups of the hydrogenated 1,2-polybutadiene and the carboxyl groups of a dicarboxylic acid and (iv) a chain consisting essentially of a chain extended hydrogenated 1,2-polybutadiene having two ends per molecule and carboxyl groups at such ends introduced by esterification between the hydroxy groups of a chain extended hydrogenated 1,2-polybutadiene having hydroxy groups at such ends and 2 to 20 urethane bonds having been prepared by reaction between the hydrogenated 1,2-polybutadiene and the diisocyanate, and the carboxyl groups of a dicarboxylic acid,
   (II) about 5 to 100 parts by weight of at least one polymerizable ethylenically unsaturated monomeric compound,
   (III) a photopolymerization initiator in an amount of about 0.001 to 10 weight percent of the total weight of the prepolymer (I) and the polymerizable ethylenically unsaturated monomeric compound (II), and
   (IV) a stabilizer in an amount of about 0.001 to 2.0 weight percent of the total weight of the prepolymer (I) and the polymerizable ethylenically unsaturated monomeric compound (II).

2. A photosensitive composition as claimed in claim 1 wherein the terminal ethylenically unsaturated group of (I) is a residue of a carboxylic acid or dicarboxylic acid having three to five carbon atoms and one ethylenically unsaturated group, its anhydride, its chloride or the dicarboxylic acid monoester of a lower alkyl alcohol having one to three carbon atoms.

3. A photosensitive composition as claimed in claim 2 wherein the carboxylic acid is methacrylic acid.

4. A photosensitive composition as claimed in claim 2 wherein the anhydride is itaconic anhydride.

5. A photosensitive composition as claimed in claim 1 wherein the terminal ethylenically unsaturated group is a residue of an alcohol having one to three ethylenically unsaturated groups and selected from the group consisting of
   (i) a compound of the formula

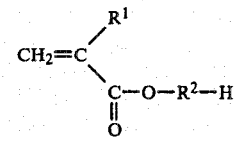

wherein
   R$^1$ represents a hydrogen atom or methyl group,
   R$^2$ represents oxycyclohexylene group, —CH$_2$C(CH$_3$)$_2$CH$_2$O— group, —CH$_2$C(CH$_2$Br)$_2$CH$_2$O— group, an oxyalkylene group of the formula

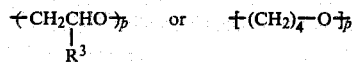

wherein
   R$^3$ represents a hydrogen atom, methyl, monochloromethyl or monobromomethyl group;
   p represents an integer of 1 to 20 or —(CH$_2$)$_q$O— group wherein q represents an integer of 5 to 20,
   (ii) trimethylolpropane di-acrylate or -methacrylate, trimethylolethane di-acrylate or -methacrylate, glycerine di-acrylate or -methacrylate and pentaerythritol tri-acrylate or -methacrylate, and
   (iii) allyl alcohol, 2-bromoallyl alcohol, 2-chloroallyl alcohol, glycerol diallylether, trimethylolpropane diallylether and allyl vinyl carbinol.

6. A photosensitive composition as claimed in claim 5 wherein the compound (i) is selected from the group consisting of 2-hydroxyethyl acrylate or methacrylate, 2-hydroxypropyl acrylate or methacrylate, 3-bromo-2-hydroxypropyl acrylate or methacrylate, 3-chloro-2-hydroxypropyl acrylate or methacrylate, 4-hydroxy-n-butyl acrylate or methacrylate, neopentyl glycol monoacrylate or monomethacrylate, dibromoneopentyl glycol monoacrylate or monomethacrylate, 1,6-hexanediol monoacrylate or monomethacrylate, 1,8-octanediol monoacrylate or monomethacrylate, 1,9-nonanediol monoacrylate or monomethacrylate, 1,10-decanediol monoacrylate or monomethacrylate, 1,12-dodecanediol monoacrylate or monomethacrylate, 1,18-octadecanediol monoacrylate or monomethacrylate, diethylene glycol monomethacrylate, dipropylene glycol monoacrylate or monomethacrylate, dibutylene glycol monoacrylate or methacrylate, tetraethylene glycol monoacrylate or methacrylate, monoacrylates or methacrylates of polyoxyethylene diols having a number average molecular weight of about 200 to 900, monoacrylates or monomethacrylates of polyoxypropylene diols having a number average molecular weight of about 300 to 1,200 and monoacrylates or monomethacrylates of polyoxybutylene diols having a number average molecular weight of about 200 to 1,500, and

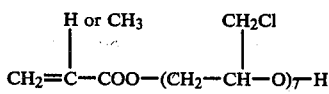

7. A photosensitive composition as claimed in claim 6 wherein the compound (i) is 2-hydroxyethyl methacrylate.

8. A photosensitive composition as claimed in claim 6 wherein the compound (i) is 2-hydroxypropyl acrylate.

9. A photosensitive composition as claimed in claim 6 wherein the compound (i) is 2-hydroxypropyl methacrylate.

10. A photosensitive composition as claimed in claim 1 wherein the terminal ethylenically unsaturated group is a residue of a compound having one ethylenically unsaturated group and one oxirane ring.

11. A photosensitive composition as claimed in claim 10 wherein the compound having one ethylenically unsaturated group and one oxirane ring is selected from the group consisting of glycidyl acylate, glycidyl methacrylate, glycidyl α-ethyl acrylate and allyl glycidyl ether.

12. A photosensitive composition as claimed in claim 1 wherein the main segment of (I) is (i) and the hydrogenated 1,2-polybutadiene has 1.5 to 2.0 terminal hydroxy groups as average per molecule.

13. A photosensitive composition as claimed in claim 1 wherein the hydrogenated 1,2-polybutadiene of (I) contains 0 to about 20 percent of 1,4-addition units.

14. A photosensitive composition as claimed in claim 1 wherein the hydrogenated 1,2-polybutadiene is poly-1-butene having about 1.2 to 2 terminal hydroxy groups as average per molecule.

15. A photosensitive composition as claimed in claim 1 wherein the main segment of (I) is (ii) and the diisocyanate is selected from the group consisting of 2,4-tolylene diisocyanate, 2,6-tolylene diisocyanate, a mixture of 2,4-tolylene diisocyanate and 2,6-tolylene diisocyanate, hydrogenated 2,4-tolylene diisocyanate, hydrogenated 2,6-tolylene diisocyanate, a mixture of hydrogenated 2,4-tolylene diisocyanate and hydrogenated 2,6-tolylene diisocyanate, 4,4'-diphenylmethane diisocyanate, hydrogenated 4,4'-diphenylmethane diisocyanate, m-xylylene diisocyanate, 1,6-hexamethylene diisocyanate, m-phenylene diisocyanate and, 3,3'-dimethyl-4,4'-diphenylmethane diisocyanate.

16. A photosensitive composition as claimed in claim 1 wherein the main segment of (I) is (iii) and the dicarboxylic acid is selected from the group consisting of oxalic acid, malonic acid, succinic acid, succinic anhydride, glutaric acid, adipic acid, pimelic acid, azelaic acid, sebacic acid, cyclopentine 1,3-dicarboxylic acid, cyclohexane 3,6-dicarboxylic acid, terephthalic acid, isophthalic acid, phthalic acid and phthalic anhydride.

17. A photosensitive composition as claimed in claim 1 wherein the main segment of (I) is (i) and the prepolymer is a polymer obtained by reaction between (1) methacrylic acid or itaconic anhydride and (2) a hydrogenated 1,2-polybutadiene having two ends per molecule and a hydrogenation ratio of pendent vinyl groups of the 1,2-addition units of 50 to 100 percent or a poly-1-butene having two ends per molecule by about 1.2 to 2 of the ends of each molecule of hydrogenated 1,2-polybutadiene or poly-1-butene carrying hydroxyl groups.

18. A photosensitive composition as claim in claim 1 wherein the main segment of (I) is (ii) or (iv) and the prepolymer is a polymer obtained by reaction between (1) methacrylic acid or itaconic anhydride and (2) a chain extended hydrogenated 1,2-polybutadiene having two ends per molecule and 2 to 20 urethane bonds or a chain extended poly-1-butene having two ends per molecule and 2 to 20 urethane bonds, about 1.2 to 2 of the ends of each molecule of hydrogenated 1,1-polybutadiene or poly-1-butene carrying hydroxyl groups, the polymer having been prepared by reaction between (i) a hydrogenated 1,2-polybutadiene having two ends per molecule and hydrogenation ratio of pendent vinyl groups of the 1,2-addition units of about 50 to 100 percent or a poly-1-butene having two ends per molecule, about 1.2 to 2 of the ends of each molecule of hydrogenated 1,1-polybutadiene or poly-1-butene carrying hydroxyl groups, and (ii) a diisocyanate selected from the group consisting of 2,4-tolylene diisocyanate, 2,6-tolylene diisocyanate, a mixture of 2,4-tolylene diisocyanate and 2,6-tolylene diisocyanate, hydrogenated 2,4-tolylene diisocyanate, hydrogenated 2,6-tolylene diisocyanate, a mixture of hydrogenated 2,4-tolylene diisocyanate and hydrogenated 2,6-tolylene diisocyanate, 4,4'-diphenylmethane diisocyanate, hydrogenated 4,4'-diphenylmethane diisocyanate, m-xylylene diisocyanate, 1,6-hexamethylene diisocyanate, m-phenylene diisocyanate and 3,3'-dimethyl-4,4'-diphenylmethane diisocyanate.

19. A photosensitive composition as claimed in claim 1 wherein the main segment of (I) is (ii) or (iv) and the prepolymer is a polymer obtained by reaction between (1) an alcohol having one ethylenically unsaturated group selected from the group consisting of 2-hydroxyethyl methacrylate, 2-hydroxypropyl acrylate, 2-hydroxypropyl methacrylate and 6-hydroxyhexyl methacrylate and (2) a chain extended hydrogenated 1,2-polybutadiene having terminal isocyanates and 2 to 20 urethane bonds or a chain extended poly-1-butene having terminal isocyanates and 2 to 20 urethane bonds having been prepared by reaction between (i) a hydrogenated 1,2-polybutadiene having two ends per molecule and a hydrogenation ratio of pendent vinyl groups of the 1,2-addition units of about 50 to 100 percent or a poly-1-butene having two ends per molecule, about 1.2 to 2 of the ends of each molecule of hydrogenated 1,2-polybutadiene or poly-1-butene carrying hydroxyl groups, and (ii) a diisocyanate selected from the group consisting of 2,4-tolylene diisocyanate, 2,6-tolylene diisocyanate, a mixture of 2,4-tolylene diisocyanate and 2,6-tolylene diisocyanate, hydrogenated 2,4-tolylene diisocyanate, hydrogenated 2,6-tolylene diisocyanate, a mixture of hydrogenated 2,4-tolylene diisocyanate and hydrogenated 2,6-tolylene diisocyanate, 4,4'-diphenylmethane diisocyanate, hydrogenated 4,4'-diphenyl-methane diisocyanate, m-xylylene diisocyanate, 1,6-hexamethylene diisocyanate, m-phenylene diisocyanate and 3,3'-dimethyl-4,4'-diphenylmethane diisocyanate.

20. A photosensitive composition as claimed in claim 1 wherein the main segment of (I) is (iii) and the prepolymer is a polymer obtained by reaction between (1) glycidyl methacrylate or allyl glycidyl ether and (2) a hydrogenated 1,2-polybutadiene having two ends per molecule or a poly-1-butene having two ends per molecule, the ends carrying carboxyl groups and having been prepared by reaction between (i) a hydrogenated 1,2-polybutadiene having two ends per molecule and a hydrogenation ratio of pendent vinyl groups of the 1,2-addition units of about 50 to 100 percent or a poly-1-butene having two ends per molecule, about 1.2 to 2 of the ends of each molecule of hydrogenated 1,2-polybutadiene or poly-1-butene carrying hydroxyl groups, and (ii) succinic anhydride or phthalic anhydride.

21. A photosensitive composition as claimed in claim 1 wherein the main segment of (I) is (iv) and the prepolymer is a polymer obtained by reaction between (1) glycidyl methacrylate or allyl glycidyl ether and (2) a chain extended hydrogenated 1,2-polybutadiene having terminal carboxyl groups or a chain extended poly-1-butene having terminal carboxyl groups obtained by reaction between (i) a chain extended 1,2-polybutadiene having terminal hydroxy groups and 2 to 20 urethane bonds or a chain extended poly-1-butene having terminal hydroxy groups and 2 to 20 urethane bonds having been prepared by reaction between a hydrogenated 1,2-polybutadiene having two ends per molecule and a hydrogenation ratio of pendent vinyl groups of the 1,2-addition units of about 50 to 100 percent or a poly-1-butene having two ends per molecule, about 1.2 to 2 of the ends of each molecule of hydrogenated 1,2-polybutadiene or poly-1-butene carrying hydroxyl groups and a diisocyanate selected from the group consisting of 2,4-tolylene diisocyanate, 2,6-tolylene diisocyanate, a mixture of 2,4-tolylene diisocyanate and 2,6-tolylene diisocyanate, hydrogenated 2,4-tolylene diisocyanate, hydrogenated 2,6-tolylene diisocyanate, a mixture of hydrogenated 2,4-tolylene diisocyanate and hydrogenated 2,6-tolylene diisocyanate, 4,4'-diphenylmethane diisocyanate, hydrogenated 4,4-diphenylmethane diisocyanate, m-xylylene diisocyanate, 1,6-hexamethylene diisocyanate, m-phenylene diisocyanate and 3,3'-dimethyl-4,4'-diphenylmethane diisocyanate and (ii) succinic anhydride or phthalic anhydride.

22. A photosensitive composition as claimed in claim 1 wherein the polymerizable ethylenically unsaturated monomeric compound II is a compound of the formula

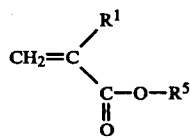

wherein
R$^1$ represents hydrogen atom or methyl group,
R$^5$ represents an alkyl group having 1 to 20 carbon atoms, cyclohexyl, alkoxyalkyl group having at most 15 carbon atoms, cyanoalkyl group having at most 8 carbon atoms, teriary amino alkyl group having at most 18 carbon atoms, a hydrogen atom, an oxyalkylene group of

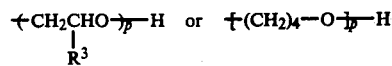

wherein
R$^3$ represents a hydrogen atom, methyl, monochloromethyl or monobromemethyl group,
p represents an integer of 1 to 20, —(CH$_2$)$_q$—OH group wherein q is an integer of 5 to 20, —CH$_2$C(CH$_3$)$_2$CH$_2$OH group or —CH$_2$C(CH$_2$Br)$_2$CH$_2$OH group.

23. A photosensitive composition as claimed in claim 13 wherein the polymerizable ethylenically unsaturated monomeric compound II is a compound of the formula

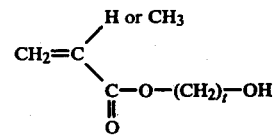

wherein t is an integer of 8 to 20.

24. A photosensitive composition as claimed in claim 1 wherein the polymerizable ethylenically unsaturated monomeric compound II is a compound of the formula

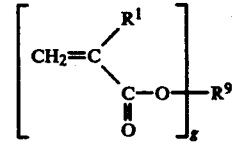

wherein
R$^1$ represents a hydrogen atom or methyl group, g is an integer of 2 to 4,
R$^9$ represents a radical of a polyol having g terminal hydroxy groups and a number average molecular weight of at most 1,000.

25. A photosensitive composition as claimed in claim 1 wherein the polymerizable ethylenically unsaturated monomeric compound II is selected from the group consisting of 2,2'-bis(4-methacryloxydiethoxyphenyl) propane, 2,2'-bis(4-acryloxydiethoxyphenyl) propane, 2,2'-(4-methacryloxyethoxyphenyl) propane and 2,2'-bis(4-acryloxyethoxyphenyl) propane.

* * * * *